(12) United States Patent
Kim

(10) Patent No.: US 6,712,956 B2
(45) Date of Patent: Mar. 30, 2004

(54) APPARATUS FOR MONITORING DISCHARGE OF PHOTORESIST

(75) Inventor: Jang Seok Kim, Suwon-shi (KR)

(73) Assignee: Silicon Tech Limited, Yongin-shi (KR)

(*) Notice: Subject to any disclaimer, the term of this patent is extended or adjusted under 35 U.S.C. 154(b) by 0 days.

(21) Appl. No.: 10/178,958

(22) Filed: Jun. 25, 2002

(65) Prior Publication Data

US 2003/0002026 A1 Jan. 2, 2003

(30) Foreign Application Priority Data

Jun. 26, 2001 (KR) .................................. 2001-36699

(51) Int. Cl.[7] .................................. B01D 35/143
(52) U.S. Cl. .................. 210/87; 210/137; 222/63; 222/189.06
(58) Field of Search .................. 210/85, 87, 137; 340/607; 222/63, 189.06; 417/43; 118/688

(56) References Cited

U.S. PATENT DOCUMENTS

| | | | | |
|---|---|---|---|---|
| 5,527,161 A | * | 6/1996 | Bailey et al. .................. | 417/53 |
| 5,589,077 A | * | 12/1996 | Matsuda et al. ............ | 210/741 |
| 5,912,043 A | * | 6/1999 | Choi et al. ..................... | 427/8 |
| 6,527,862 B2 | * | 3/2003 | McLoughlin et al. ....... | 118/313 |
| 6,554,579 B2 | * | 4/2003 | Martin et al. .................. | 417/53 |

\* cited by examiner

*Primary Examiner*—Terry Cecil
(74) *Attorney, Agent, or Firm*—Roth & Goldman, P.A.

(57) ABSTRACT

A photoresist discharge monitoring apparatus in which the photoresist discharge rate is monitored by a discharge pump, and based on this monitoring, the discharge pump is controlled, so that a constant photoresist discharge rate is ensured to prevent any occurrence of process defects due to the discharge pump. If the photoresist discharge rate is decreased due to the exhaustion of the life expectancy of the chemical filter, a filter replacement necessity is displayed. That is, a PR (photoresist) discharge rate sensor senses the photoresist discharge rate, the discharge rate being decided by the discharge pump. Further, a PR discharge rate controller monitors the output signals of the PR discharge rate sensor to automatically control the photoresist discharge rate of the discharge pump, and judges on a chemical filter replacement necessity upon the arrival of the operating limit in the step motor so as to output filter replacement signals.

3 Claims, 3 Drawing Sheets

APPARATUS FOR MONITORING DISCHARGE OF PHOTORESIST

FIELD OF THE INVENTION

The present invention relates to a photoresist discharge monitoring apparatus. Particularly, the present invention relates to a photoresist discharge monitoring apparatus in which the photoresist discharge rate is monitored during its discharge by a discharge pump, and based on this monitoring, the discharge pump is controlled, so that a constant photoresist discharge rate is ensured, thereby making it possible to prevent any occurrence of process defects due to the discharge pump.

BACKGROUND OF THE INVENTION

At the photoresist treatment step in the semiconductor device fabricating process, a photoresist is spread on the surface of the treating object such as a wafer to form a photoresist film on it. Then the photoresist film is exposed to a predetermined pattern, and then, a development is carried out by using a certain development fluid.

The spreading of the photoresist is carried out in the following manner. That is, as shown in FIG. 1, the photoresist is discharged from a photoresist-containing vessel 1 by a discharge pump 3 in accordance with pumping signals which are supplied from a spinner control device.

Under this condition, the photoresist is discharged after foreign materials are filtered off by a chemical filter 2, and when the photoresist is discharged by the discharge pump 3, the photoresist passes through a cut-off/suck-back valve 4 and a nozzle 5 to be spread on a wafer 6.

When the photoresist is discharged by the discharge pump 3, the photoresist is discharged at a constant rate. However, if a facility malfunction occurs, or if the life expectancy of the chemical filter 2 has been exhausted to the degree of a filtering failure, then the photoresist cannot be spread to a proper degree, with the result that a wafer defect occurs.

SUMMARY OF THE INVENTION

The present invention is intended to overcome the above described disadvantage of the conventional technique.

Therefore it is an object of the present invention to provide a photoresist discharge monitoring apparatus in which the photoresist discharge rate is monitored during its discharge by the discharge pump, and based on this monitoring, the discharge pump is controlled so as to ensure a constant discharge rate of the photoresist.

It is another object of the present invention to provide a photoresist discharge monitoring apparatus in which if the photoresist discharge rate is decreased due to the exhaustion of the life expectancy of the chemical filter, a filter replacement necessity is displayed, thereby making it possible to prevent any occurrence of process defects.

In achieving the above objects, the photoresist discharge monitoring apparatus used in discharging a photoresist from a photoresist-containing vessel by driving a discharge pump and a step motor according to the present invention includes: a PR (photoresist) discharge rate sensor for sensing the photoresist discharge rate, the discharge rate being decided by the discharge pump; and a PR discharge rate controller for monitoring the output signals of the PR discharge rate sensor to automatically control the photoresist discharge rate of the discharge pump, and for judging a chemical filter replacement necessity upon an arrival of an operating limit in the step motor so as to output filter replacement signals.

The PR discharge rate controller includes: a PR discharge rate calculating part for calculating the photoresist discharge rate of the discharge pump based on pulses of the PR discharge rate sensor; a PR discharge rate control part for sending the pumping control signals to the discharge pump based on calculated values of the PR discharge rate calculating part to control the step motor so as to automatically control the photoresist discharge rate, and for outputting the filter replacement necessity signals by judging on the filter replacement necessity upon arrival of the operating limit in the step motor; and a display part for displaying the filter replacement necessity signals and other signals from the PR discharge rate control part.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENT

Now the preferred embodiment of the present invention will be described in detail referring to the attached drawings.

Figure 1:
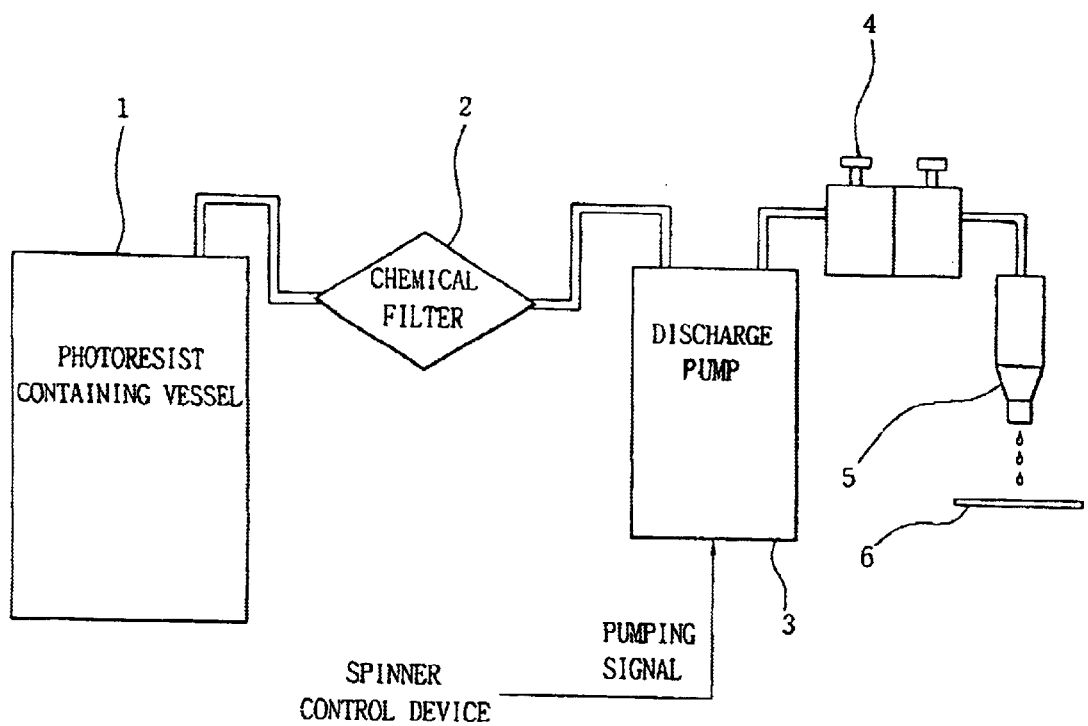
FIG. 1 schematically illustrates the constitution of the general photoresist spreading apparatus.
Figure 2:
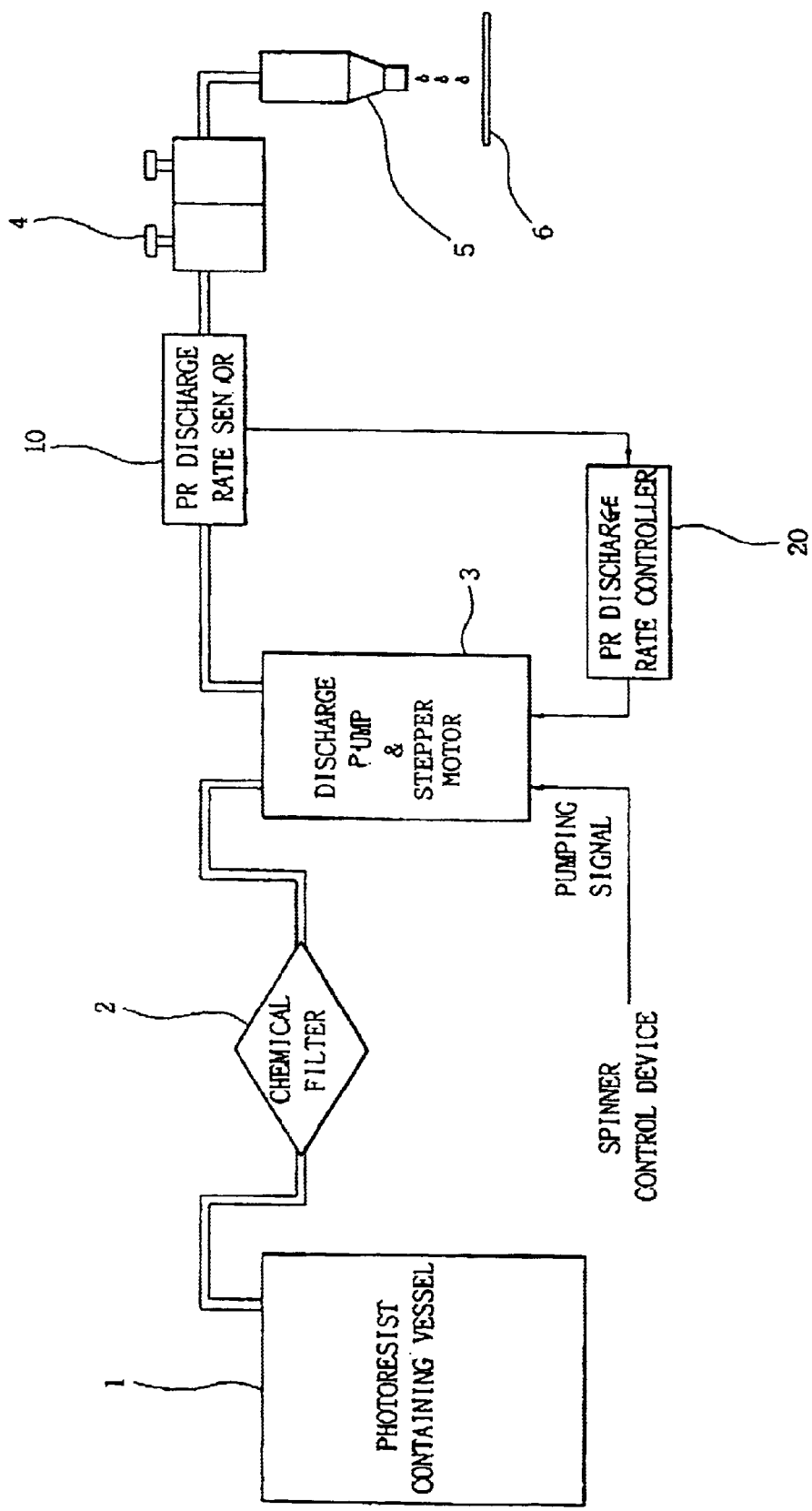
FIG. 2 illustrates the overall constitution of the photoresist discharge monitoring apparatus according to the present invention.
Figure 3:
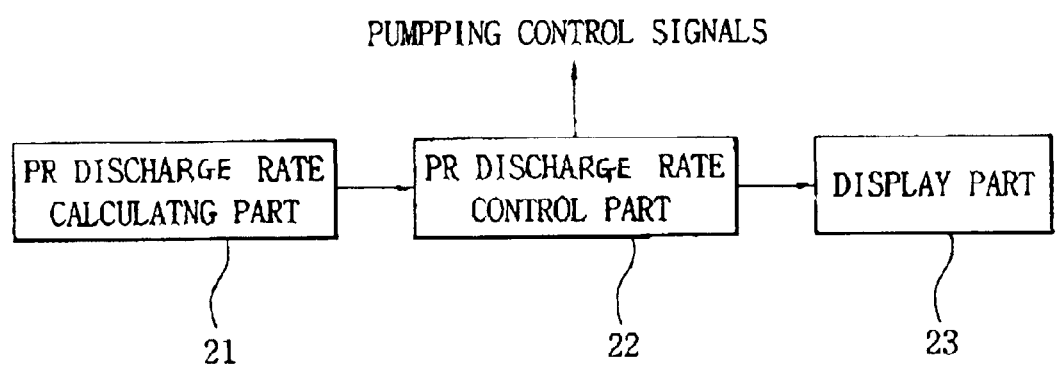
FIG. 3 illustrates in detail the constitution of the PR discharge rate controller of FIG. 2.

FIG. 2 illustrates the overall constitution of the photoresist discharge monitoring apparatus according to the present invention. That is, in the present invention, the following elements are added to the general photoresist spreading apparatus of FIG. 1.

That is, there are added: a PR (photoresist) discharge rate sensor 10 for sensing the photoresist discharge rate, the discharge rate being decided by the discharge pump 3; and a PR discharge rate controller 20 for monitoring the output signals of the PR discharge rate sensor 10 to automatically control the photoresist discharge rate of the discharge pump 3, and for judging a chemical filter replacement necessity upon the arrival of the operating limit in a step motor so as to output chemical filter replacement signals.

The elements which are common to the conventional apparatus will be assigned with the same reference codes.

The PR discharge rate sensor 10 outputs certain signals in accordance with the photoresist discharge rate of the discharge pump 3.

The PR discharge rate controller 20 includes: a PR discharge rate calculating part 21, a PR discharge rate control part 22, and a display part 23.

The PR discharge rate calculating part 21 calculates the photoresist discharge rate of the discharge pump 3 based on pulses of the PR discharge rate sensor 10. The PR discharge rate control part 22 sends pumping control signals to the discharge pump 3 based on the calculated values of the PR discharge rate calculating part 21 to control the step motor so as to automatically control the photoresist discharge rate; and outputs filter replacement necessity signals by judging on the filter replacement necessity upon arrival of the operating limit in the step motor. The display part displays the filter replacement necessity signals and other signals from the PR discharge rate control part 22.

In the present invention constituted as described above, the discharge pump 3 discharges the photoresist from a photoresist-containing vessel 1 in accordance with the pumping signals which are furnished from a spinner control device (not illustrated). Under this condition, the spinner control device sends a discharge execution signal to the PR discharge rate controller 20, thereby notifying the starting of the discharge.

When the discharge pump 3 discharges the photoresist, the PR discharge rate sensor 10 outputs pulses in accordance with the photoresist discharge rate.

The pulses thus outputted from the PR discharge rate sensor 10 are inputted into the PR discharge rate calculating part 21, and the PR discharge rate calculating part 21 calculates the photoresist discharge rate based on the pulses to input the calculated data into the PR discharge rate control part 22.

The PR discharge rate control part 22 automatically controls the driving of the step motor (which drives the discharge pump 3) based on the data inputted from the PR discharge rate calculating part 21, thereby making the discharge rate constant.

That is, the PR discharge rate control part 22 has a reference driving value for the step motor (which drives the discharge pump 3) in a predetermined state. Thus if the photoresist discharge rate which is inputted from the PR discharge rate calculating part 21 is smaller than the reference driving value, then the driving of the step motor is increased, so that the photoresist discharge rate would increase.

On the other hand, if the photoresist discharge rate which is inputted from the PR discharge rate calculating part 21 is larger than the reference driving value, then the driving of the step motor is slowed down, so that the photoresist discharge rate would decrease, thereby making it possible to maintain a constant photoresist discharge rate.

If the discharge rate is insufficient in spite of the fact that the step motor has been driven to the upper limit of operation, then it is judged that it is the time for replacement of the chemical filter 2.

Accordingly, the PR discharge rate control part 22 outputs filter replacement signals to the display part 23, thereby displaying a message for a filter replacement necessity. Under this condition, the PR discharge rate control part 22 sends the filter replacement necessity signals or other error signals also to the spinner control device.

Further, the PR discharge rate control part 22 outputs the discharge rate display signals to the display part 23 at every unit period based on the photoresist discharge rates which are inputted from the PR discharge rate calculating part 21, thereby displaying the photoresist discharge rate at every unit period. Thus the photoresist discharge rate can be monitored.

Further, if the total photoresist storage amount of the photoresist-containing vessel 1 is recorded in the PR discharge rate control part 22, then the remaining amount of the photoresist in the photoresist-containing vessel 1 can be known at every moment, because the already discharged amount of the photoresist can be calculated at any moment (the rate is the amount per unit time).

In the above, the present invention was described based on the specific preferred embodiment and the attached drawings, but it should be apparent to those ordinarily skilled in the art that various changes and modifications can be added without departing from the spirit and scope of the present invention, which will be defined in the appended claims.

According to the present invention as described above, the following effects can be obtained.

First, the discharge rate of the photoresist can be monitored, and therefore, based on the monitored data, a constant photoresist discharge rate can be achieved.

Second, by utilizing the reference driving value and the operation limit of the step motor, there can be judged on the chemical filter replacement necessity. This replacement necessity is displayed on the display part.

Third, the monitoring for the discharge of the photoresist is possible, and therefore, the causes of the process defects can be detected.

Fourth, the photoresist discharge rate is known, that is, the discharged amount of the photoresist per unit time is known, and therefore, the remaining amount of the photoresist in the containing vessel can be known, as well as the remaining discharge time.

What is claimed is:

1. A photoresist discharge monitoring apparatus used in discharging a photoresist from a photoresist-containing vessel by driving a discharge pump and a step motor, comprising:

a PR (photoresist) discharge rate sensor adapted for sensing the photoresist discharge rate, the discharge rate being decided by the discharge pump; and a PR discharge rate controller adapted for monitoring output signals of the PR discharge rate sensor to automatically control the photoresist discharge rate of the discharge pump, and for judging a chemical filter replacement necessity upon an arrival of an operating limit in the step motor so as to output filter replacement signals.

2. The photoresist discharge monitoring apparatus as claimed in claim 1, wherein the PR discharge rate sensor outputs certain pulses in accordance with the photoresist discharge rate during pumping of the photoresist by the discharge pump.

3. The photoresist discharge monitoring apparatus as claimed in claim 1, wherein the PR discharge rate controller comprises:

a PR discharge rate calculating part adapted for calculating the photoresist discharge rate of the discharge pump based on pulses of the PR discharge rate sensor;

a PR discharge rate control part adapted for sending pumping control signals to the discharge pump based on calculated values of the PR discharge rate calculating part to control the step motor so as to automatically control the photoresist discharge rate, and for outputting filter replacement necessity signals by judging on a filter replacement necessity upon arrival of an operating limit in the step motor; and a display part adapted for displaying the filter replacement necessity signals and other signals from the PR discharge rate control part.

* * * * *